US011751406B2

(12) United States Patent
Hsieh et al.

(10) Patent No.: US 11,751,406 B2
(45) Date of Patent: Sep. 5, 2023

(54) 3D RRAM CELL STRUCTURE FOR REDUCING FORMING AND SET VOLTAGES

(71) Applicant: Taiwan Semiconductor Manufacturing Company, Ltd., Hsin-Chu (TW)

(72) Inventors: Te-Hsien Hsieh, Hsin-Chu (TW); Tzu-Yu Chen, Kaohsiung (TW); Kuo-Chi Tu, Hsin-Chu (TW); Yuan-Tai Tseng, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 63 days.

(21) Appl. No.: 17/392,760

(22) Filed: Aug. 3, 2021

(65) Prior Publication Data

US 2021/0366987 A1    Nov. 25, 2021

Related U.S. Application Data

(63) Continuation of application No. 16/575,663, filed on Sep. 19, 2019, now Pat. No. 11,088,203.
(Continued)

(51) Int. Cl.
*H01L 27/24*    (2006.01)
*H01L 45/00*    (2006.01)
(Continued)

(52) U.S. Cl.
CPC ......... *H10B 63/30* (2023.02); *G11C 13/0002* (2013.01); *H10N 70/011* (2023.02); *H10N 70/826* (2023.02); *H10N 70/841* (2023.02)

(58) Field of Classification Search
CPC .............. H01L 27/2436; H01L 27/115; H01L 27/11507; H01L 27/1159; H01L 45/1233;
(Continued)

(56) References Cited

U.S. PATENT DOCUMENTS 7,791,925 B2    9/2010  Li et al.
7,808,816 B2    10/2010 Tanaka et al.
(Continued)

FOREIGN PATENT DOCUMENTS

WO    2018004697 A1    1/2018

OTHER PUBLICATIONS

Non-Final Office Action dated Oct. 15, 2020 for U.S. Appl. No. 16/575,663.
(Continued)

*Primary Examiner* — Nikolay K Yushin
(74) *Attorney, Agent, or Firm* — Eschweiler & Potashnik, LLC

(57) ABSTRACT

An RRAM cell stack is formed over an opening in a dielectric layer. The dielectric layer is sufficiently thick and the opening is sufficiently deep that an RRAM cell can be formed by a planarization process. The resulting RRAM cells may have a U-shaped profile. The RRAM cell area includes contributions from a bottom portion in which the RRAM cell layers are stacked parallel to the substrate and a side portion in which RRAM cell layers are stacked roughly perpendicular to the substrate. The combined side and bottom portions of the curved RRAM cell provide an increased area in comparison to a planar cell stack. The increased area lowers forming and set voltages for the RRAM cell.

20 Claims, 5 Drawing Sheets

Related U.S. Application Data

(60) Provisional application No. 62/879,626, filed on Jul. 29, 2019.

(51) Int. Cl.
  *G11C 13/00* (2006.01)
  *H10B 63/00* (2023.01)
  *H10N 70/00* (2023.01)

(58) Field of Classification Search
  CPC . H01L 45/1253; H01L 45/16; G11C 13/0002; G11C 13/0011; G11C 13/0097; H10B 63/30; H10B 63/80; H10B 63/84; H10N 70/826; H10N 70/841; H10N 70/011
  See application file for complete search history.

(56) References Cited

U.S. PATENT DOCUMENTS

| | | | |
|---|---|---|---|
| 8,000,128 B2 | 8/2011 | Li et al. | |
| 9,040,951 B2 | 5/2015 | Sung et al. | |
| 9,172,036 B2 | 10/2015 | Chen et al. | |
| 9,847,481 B2 * | 12/2017 | Chang | H01L 27/2436 |
| 9,972,771 B2 * | 5/2018 | Mo | H01L 43/08 |
| 10,163,651 B1 | 12/2018 | Chen et al. | |
| 10,164,184 B2 | 12/2018 | Sung et al. | |
| 2008/0089104 A1 | 4/2008 | Tanaka et al. | |
| 2014/0021584 A1 | 1/2014 | Tu et al. | |
| 2015/0060750 A1 | 3/2015 | Sung et al. | |
| 2015/0144859 A1 | 5/2015 | Chen et al. | |
| 2016/0359108 A1 | 12/2016 | Majhi et al. | |
| 2017/0117467 A1 | 4/2017 | Chang et al. | |
| 2017/0207387 A1 | 7/2017 | Yang et al. | |
| 2017/0279036 A1 * | 9/2017 | Mo | H01L 43/02 |
| 2018/0019390 A1 | 1/2018 | Chen et al. | |
| 2019/0148638 A1 | 5/2019 | Sung et al. | |

OTHER PUBLICATIONS

Notice of Allowance dated Apr. 6, 2021 for U.S. Appl. No. 16/575,663.

* cited by examiner

3D RRAM CELL STRUCTURE FOR REDUCING FORMING AND SET VOLTAGES

REFERENCE TO RELATED APPLICATIONS

This Application is a Continuation of U.S. application Ser. No. 16/575,663, filed on Sep. 19, 2019, which claims the benefit of U.S. Provisional Application No. 62/879,626, filed on Jul. 29, 2019. The contents of the above-referenced Patent Applications are hereby incorporated by reference in their entirety.

BACKGROUND

Resistance switching random access memory (RRAM) has a simple structure, low operating voltage, high-speed, good endurance, and CMOS process compatibility. RRAM is the most promising alternative to provide a downsized replacement for traditional flash memory. RRAM is finding wide application in devices such as optical disks and non-volatile memory arrays.

An RRAM cell stores data within a layer of material that can be induced to undergo a phase change. The phase change can be induced within all or part of the layer to switch between a high resistance state and a low resistance state. The resistance state can be queried and interpreted as representing either a "0" or a "1". In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
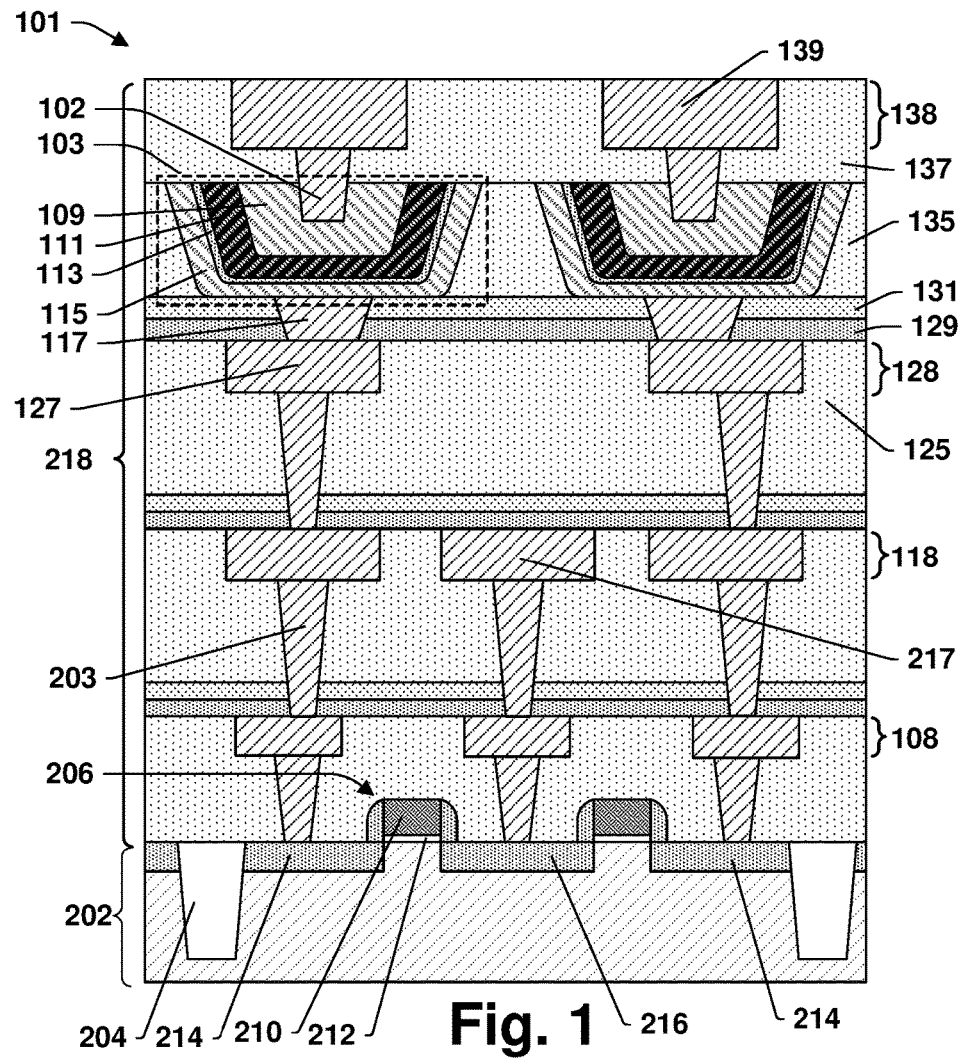
FIG. 1 illustrates a cross-sectional view of an integrated circuit (IC) with RRAM cells according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Forming and set voltages increase as RRAM cell area becomes smaller. The present disclosure provides an RRAM cell geometry that lowers forming and set voltages without reducing device density. According to the present disclosure, an RRAM cell stack is formed over an opening in a dielectric layer. The dielectric layer is sufficiently thick and the opening in the dielectric layer is sufficiently deep in relation to the RRAM cell layer thickness that an RRAM cell can be formed by a planarization process that removes portion of the RRAM cell stack that lie outside the opening in the dielectric layer.

The resulting RRAM cells may have a U-shaped profile and has an area that includes contributions from a bottom portion of the RRAM cell in which the RRAM cell layers are stacked parallel to the substrate and a side portion of the RRAM cell in which the RRAM cell layers are stacked along a steep grade that may be nearly perpendicular to the substrate. For example, the bottom portion may be disc-shaped and the side portion may have the shape of a truncated cone that is nearly cylindrical. In another example, the bottom portion is rectangular and the side portion includes four trapezoids having shared edges. The combined side and bottom portions of the RRAM cell with the U-shaped profile provide a much larger area than a flat RRAM cell having the same footprint. The increased area lowers forming and set voltages for the RRAM cell. The fraction of the cell area that is ineffective due to edge effects is lessened, which facilitates scaling.

The layers of an RRAM cell stack according to the present disclosure curve to form edges that are all aligned in a plane. The plane may be parallel to a surface of the substrate whereby the tops of each of the layers that form the RRAM cell stack are the same height over the substrate. The ordering from "lower" to "upper" as used with reference to an RRAM cell stack according to the present disclosure refers to the order of layers through which electricity passes when traveling through the RRAM cell stack from a bottom electrode via immediately below the RRAM cell stack to a top electrode via immediately above the RRAM cell stack. Each of the lower layers may curve to encompass the layers above. At least the bottom electrode layer and the resistance switching dielectric layer may have edges that curve to form closed loops in a plane.

In some of these teachings, the dielectric layer having the opening over which the RRAM cell stack is formed is an interlevel dielectric layer. In some of these teachings, the interlevel dielectric is a low-K dielectric layer. In some of these teachings, the interlevel dielectric is an extremely low-K dielectric layer. The RRAM cell stack may be formed between two adjacent metal interconnect layers. In some of these teachings, the depth of the opening in which the RRAM cell stack is formed is half or more the distance between the two metal interconnect layers.

FIG. 1 illustrates a cross-sectional view of a portion of an integrated circuit device 101 including memory cells 103 according to some aspects of the present disclosure. Each memory cell 103 include a bottom electrode layer 115, a resistance switching layer 113, an active metal layer 111, and a top electrode layer 109. RRAM cells 103 are surrounded by interlevel dielectric layer 135. Top electrode layer 109 is coupled to metal feature 139 in metal interconnect 138 by a top electrode via 102. Metal feature 139 and top electrode via 102 are surrounded by interlevel dielectric layer 137. Interlevel dielectric 137 may be the same material as interlevel dielectric layer 135. Bottom electrode layer 115 is coupled to metal feature 127 in metal interconnect layer 128 by a bottom electrode via 117. Bottom electrode via 117 is surrounded by etch stop layer 129 and interfacial layer 131. Etch stop layer 129 and interfacial layer 131 may have higher dielectric constants that interlevel dielectric layer 135. Metal feature 127 is surrounded by a matrix of interlevel dielectric 125.

Metal interconnect layer 128 and metal interconnect layer 138 are part of a metal interconnect structure 218 disposed over a substrate 202. Metal interconnect layer 128 may be the third interconnect layer over substrate 202 and metal interconnect layer 138 may be the fourth. Metal interconnect structure 218 also includes a first metal interconnect layer 108, a second metal interconnect layer 118, and may include additional interconnect layers above the ones that are shown. In some of these teachings, memory cells 103 are located between the third metal interconnect layer 128 and the fourth metal interconnect layer 138 as shown in the illustration. In some of these teachings, memory cells 103 are located between a fourth metal interconnect layer 138 and a fifth metal interconnect layer. In general, memory cells 103 may be located between any adjacent pair of metal interconnect layers.

Substrate 202 may be, for example, a bulk substrate (e.g., a bulk silicon substrate) or a silicon-on-insulator (SOI) substrate, or the like. One or more shallow trench isolation (STI) regions 204 or oxide-filled trenches may be disposed in or on substrate 202. A pair of word line transistors 206 may be located between STI regions 204. Word line transistors 206 may include gates 210 that are operative as word lines. Gates 210 are separated from substrate 202 by word line dielectric layers 212. Source/drain regions 214, 216 for word line transistors 206 may be formed in or on substrate 202. A metal feature 217 in second metal interconnect layer 118 or elsewhere in metal interconnect structure 218 may be coupled to source/drain region 216 and be operative as a source line. Bottom electrodes 115 may be coupled to source/drain regions 214 through vias 203. Metal feature 139 in fourth metal interconnect layer 138 or some other metal interconnect layer above memory cells 103 may be operative as bit lines. The illustrated control structure for memory cells 103 in IC device 101 is one of many possible control structures that may be used to connect and operate memory cells 103. IC devices according to the present disclosure is not limited in terms of control structure.

Metal interconnect structure 218 is the product of back-end-of-line (BEOL) processing. Metal features 139, 217 of metal interconnect layers 108, 118, 128, 138 and vias 102, 117, 133, 203 may be formed of metals such as copper, aluminum, gold, tungsten, and the like. Interlevel dielectric layers 135, 137 may be low κ dielectrics or extremely low κ dielectrics. A low-k dielectric is a material having a smaller dielectric constant than $SiO_2$. $SiO_2$ has a dielectric constant of about 3.9. Examples of low-k dielectrics include organosilicate glasses (OSG) such as carbon-doped silicon dioxide, fluorine-doped silicon dioxide (otherwise referred to as fluorinated silica glass (FSG), organic polymer low-k dielectrics, and porous silicate glass. An extremely low-k dielectric is a material having a dielectric constant of about 2.1 or less. An extremely low-k dielectric material is generally a low-k dielectric material formed into a porous structure. Porosity reduces the effective dielectric constant.

Figure 2:
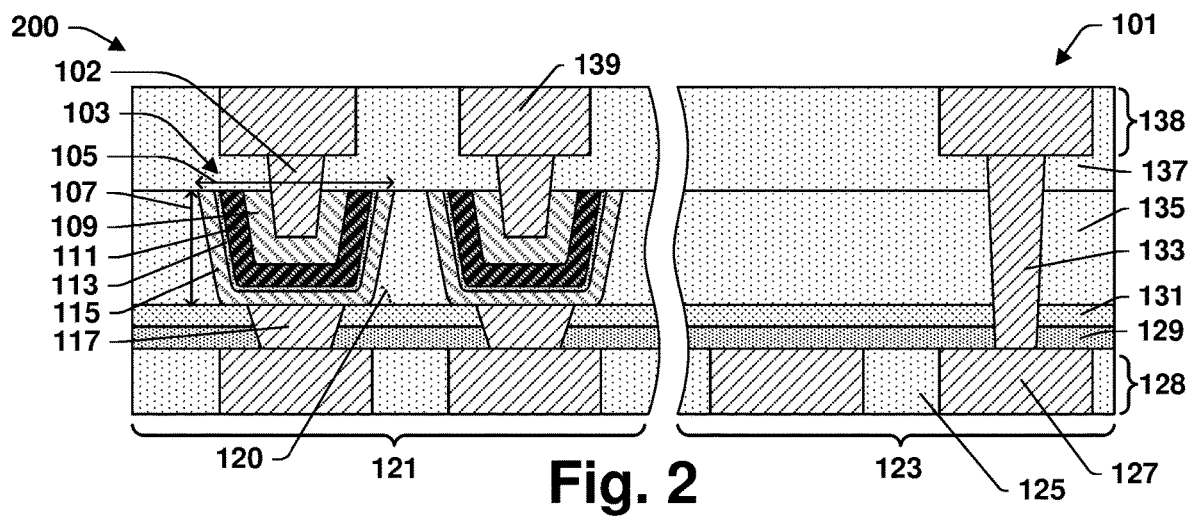
FIG. 2 illustrates another cross-sectional view of an integrated circuit (IC) with RRAM cells according to some aspects of the present disclosure.

FIG. 2 illustrates a cross-sectional view 200 of another portion of the IC device 101. Cross-sectional view 200 includes a portion of a memory region 121 including two RRAM cells 103 and a portion of a peripheral area 123 outside memory region 121. Cross-sectional view 200 focuses on an area between third metal interconnect layer 128 and fourth metal interconnect layer 129.

Figure 3:
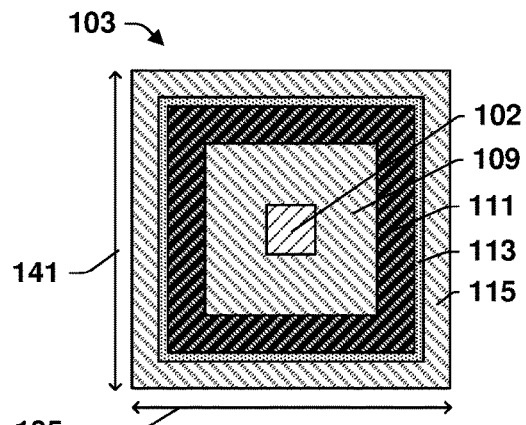
FIG. 3 provide a top view of an RRAM cell in the integrated circuit device of FIG. 1.

FIG. 3 illustrates a top view of a memory cell 103. The layers of memory cell 103 are shown as square-sided, but the edges may be rounded. Memory cell 103 could equally be disc-shaped or have another shape consistent with the present teachings. Bottom electrode layer 115, switching layer 113, active metal layer 111, and top electrode layer 109 are stacked and nested like an inverted set of Russian dolls. The nesting is such that bottom electrode layer 115 surrounds resistance switching layer 113, switching layer 113 surrounds active metal layer 111, and active metal layer 111 surrounds top electrode layer 109. Each surrounding layer curves to encompass the layers it surrounds. The edges of these layers all terminate in a plane at the top of memory cell 103. This structure is the result of a planarization process that defines the edges.

The area of memory cell 103 includes a contribution from the bottom and a contribution from the sides. Making memory cell 103 steep-sided increases the overall area for a given footprint size. The angle 120 (see FIG. 2) between the sides of memory cell 103 and the top of interfacial layer 131 may be greater than 45 degrees. In some of these teachings, the angle 120 is greater than 60 degrees. In some of these teachings, the angle 120 is greater than 75 degrees. In some of these teachings, the angle 120 is greater than 90 degrees.

Memory cell 103 may have any suitable dimensions. In some of these teachings, the width 105 and the length 141 are in the range from 25 nm to 1000 nm. In some of these teachings, the width 105 and the length 141 are in the range from 50 nm to 500 nm. In some of these teachings, the height 107 of memory cell 103 is in the range from 25 nm to 1000 nm. In some of these teachings, the height 107 is in the range from 50 nm to 250 nm. In some of these teachings, the height 107 is in the range from 75 nm to 200 nm, for example, about 100 nm. The height 107 may be much greater than the combined thicknesses of etch stop layer 129 and interfacial layer 131.

The contribution of the sides is comparable to or greater than the contribution of the bottom to the overall area of memory cell 103. In some of these teachings the contribution of the sides to the area is greater than the contribution of the bottom to the area. In some of these teachings the contribution of the sides is two or more times larger than the contribution of the bottom. If angle 120 is close to 90 degrees and the bottom is square-sided, the ratio of the contribution of the sides to the contribution of the bottom is approximately four times the ratio of the height 107 to the width 105. Accordingly, in some of these teachings the height 107 is at least one quarter the width 105, and in some of these teachings, the height 107 is at least half the width 105.

Each of the layers in memory cell 103 may include a plurality of layers having various compositions. Bottom electrode via 117 may be titanium nitride or the like or another suitable conductive material. In some examples, the thickness of bottom electrode via 117 is in the range from about 250 Å to about 500 Å. A diffusion barrier layer may separate bottom electrode via 117 from metal 127. A barrier lay could be, for example tantalum nitride or the like. In some examples, the thickness of the barrier layer is the range from about 50 Å to about 100 Å.

Bottom electrode layer 115 is a conductive material such as titanium nitride, tantalum nitride, a combination thereof, or the like. Bottom electrode layer 115 could also be titanium, tantalum, platinum, gold, iridium, tungsten, nickel, ruthenium, copper, or the like. In some of these teachings, the thickness of bottom electrode layer 115 is in the range from about 20 Å Å to about 200 Å. In some of these teachings, the thickness of bottom electrode layer 115 is in the range from about 50 Å to about 150 Å. These exemplary thicknesses, along with other example dimensions given hereafter, is for a certain fabrication node. The exemplary dimensions may be scaled proportionally for other fabrication nodes.

Resistance switching layer 113 is a dielectric layer having a resistance that may be varied through a hysteresis effect. Switching layer 113 may be a dielectric layer through which conductive bridges can reversibly form. In some examples, switching layer 113 is a metal oxide. In some examples, switching layer 113 is a high-k dielectric. Switching layer 113 may be, for example, nickel oxide, tantalum oxide, tantalum hafnium oxide, tantalum aluminum oxide, hafnium oxide, tungsten oxide, zirconium oxide, aluminum oxide, strontium titanium oxide, or the like. In some of these teachings, the thickness of switching layer 113 is in the range from about 20 Å to about 100 Å. In some of these teachings, the thickness of switching layer 113 is in the range from about 30 Å to about 70 Å.

Depending on the memory type, memory cell 103 may include an active metal layer 111 that facilitates resistance switching. Active metal layer 115 may be a metal that alternately provides and absorbs ions to promote the resistance switching function. In some embodiments, active metal layer 111 is a metal or a metal oxide that is relatively low in oxygen concentration. Examples of metals that may be suitable for active metal layer 111 include titanium, hafnium, platinum, aluminum, silver, gold, copper, and the like. In some of these teachings, the thickness of active metal layer 111 is in the range from about 20 Å to about 100 Å. In some of these teachings, the thickness of active metal layer 111 is in the range from about 30 Å to about 70 Å.

A top electrode layer 109 is arranged over the resistance switching layer 113. Top electrode layer 109 may include a liner of tungsten or the like. Top electrode layer 109 may comprise one or more layers of metal or metal compounds such as titanium, titanium nitride, tantalum, tantalum nitride, or the like. In some of these teachings, the thickness of top electrode layer 109 is in the range from about 100 Å to about 400 Å. In some of these teachings, the thickness of top electrode layer 109 is in the range from about 150 Å to about 350 Å. Top electrode layer 109 may be sufficiently thick to complete the filling of an opening in dielectric 135 within which memory cell 103 is formed.

During operation of memory cell 103, voltages are applied between top electrode layer 109 and bottom electrode layer 115. Depending on the voltages applied, the voltages may be used to assess whether memory cell 103 is in a low resistance state or a high resistance state or to place memory cell 103 in a high resistance state or a low resistance state. Memory cell 103 may be any type of resistance switching random access memory. Examples of resistance switching random access memory include, without limitation, magnetoresistive random access memory (MRAM), ferroelectric random access memory (FRAM), phase-change memory (PCM), oxygen displacement memory (OxRAM), conductive bridging random access memory (CBRAM), carbon nano tube random access memory (NRAM), and the like. The number of layers, the layer thicknesses, and the layer compositions for memory cell 103 may be varied accordingly.

FIGS. 4-13 provide a series of cross-sectional views 400-1300 that illustrate an integrated circuit device according to the present disclosure at various stages of manufacture according to a process of the present disclosure. Although FIGS. 4-13 are described in relation to a series of acts, it will be appreciated that the order of the acts may in some cases be altered and that this series of acts are applicable to structures other than the ones illustrated. In some embodiments, some of these acts may be omitted in whole or in part. Furthermore, FIGS. 4-13 are described in relation to a series of acts, it will be appreciated that the structures shown in FIGS. 4-13 are not limited to a method of manufacture but rather may stand alone as structures separate from the method.

Figure 4:
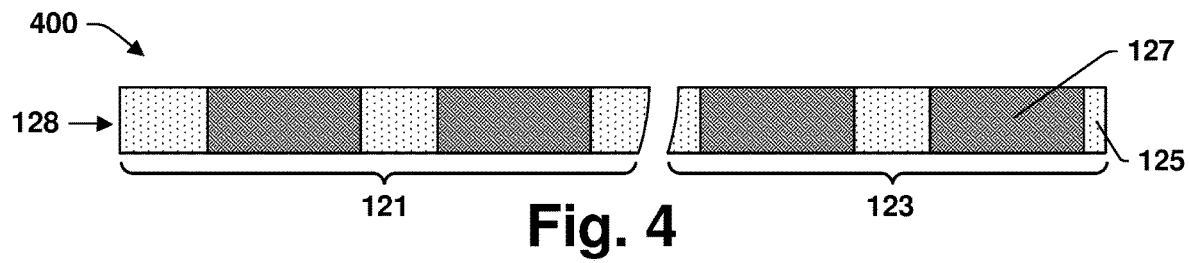
FIGS. 4-13 illustrate a series of cross-sectional views of an IC according to some aspects of the present disclosure undergoing a manufacturing process according to some aspects of the present disclosure.

FIG. 4 illustrate a cross-sectional view 400 of an IC device after formation of third metal interconnect 128. Third metal interconnect 128 may be formed by any suitable process. Examples of suitable processes include damascene and dual damascene processes.

Figure 5:
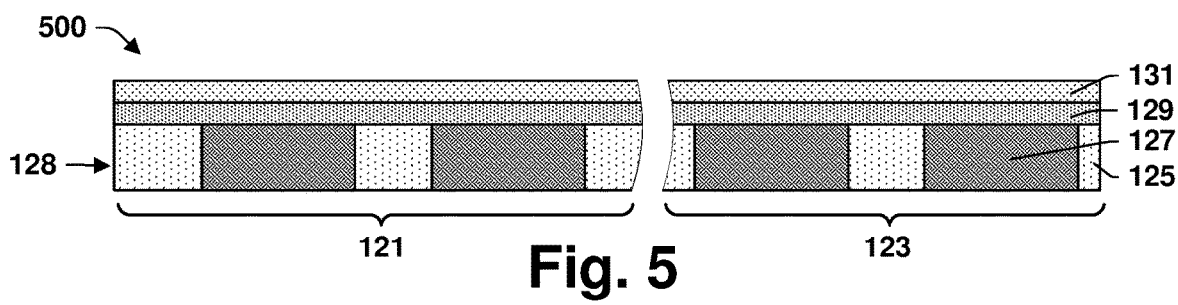

As illustrated by the cross-sectional view 500 of FIG. 5, etch stop layer 129 and interfacial layer 131 are formed over third metal interconnect 128. Etch stop layer 129 may be, for example, and silicon carbide (SiC). Interfacial layer 131 may be, for example, silicon dioxide ($SiO_2$). These layers may also be or include other dielectrics such as silicon nitride ($Si_3N_4$), silicon oxynitride (SiON), silicon oxycarbide (SiOC), or the like. The combined thickness of etch stop layer 129 and interfacial layer 131 may be in the range from 150 to 600 Å. In some embodiments, the combined thickness of etch stop layer 129 and interfacial layer 131 is in the range from 250 to 500 Å. In some embodiments, the combined thickness of etch stop layer 129 and interfacial layer 131 is less than 400 Å, for example, 300 Å. Etch stop layer 129 and interfacial layer 131 may be formed by any suitable process or combination of processes.

Figure 6:
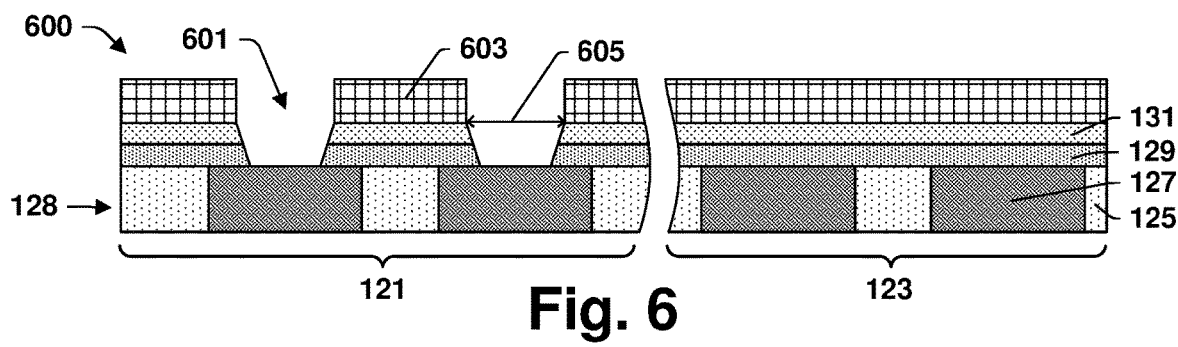

As illustrated by the cross-sectional view 600 of FIG. 6, a mask 603 may be formed over etch stop layer 129 and interfacial layer 131 and used to form openings 601 through are etch stop layer 129 and interfacial layer 131. Openings 601 are positioned over metal features 127 in metal interconnect 128. Mask 603 may be a photoresist mask patterned using photolithography. Openings 601 may be formed using any suitable etch process, for example, plasma etching. The widths 605 of openings 601 may be in the range from 10 nm to 100 nm. In some embodiments, the widths 605 are in the range from 45 nm to 100 nm, for example, 50 nm. In some embodiments, the aspect ratio of openings 601 (ratio of width 605 to the combined thickness of etch stop layer 129 and interfacial layer 131) is in the range from 1:1 to 4:1. In some embodiments the aspect ratio of opening 601 is in the range from 1.5:1 to 3:1, for example, 5:3.

Figure 7:
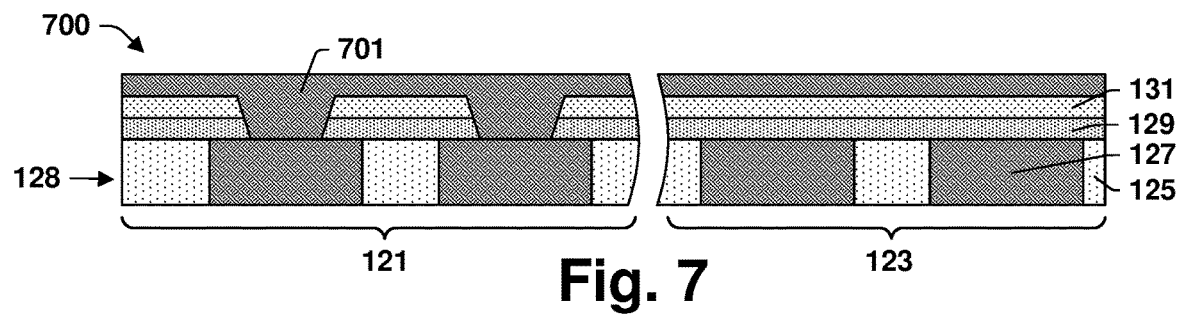
Figure 8:
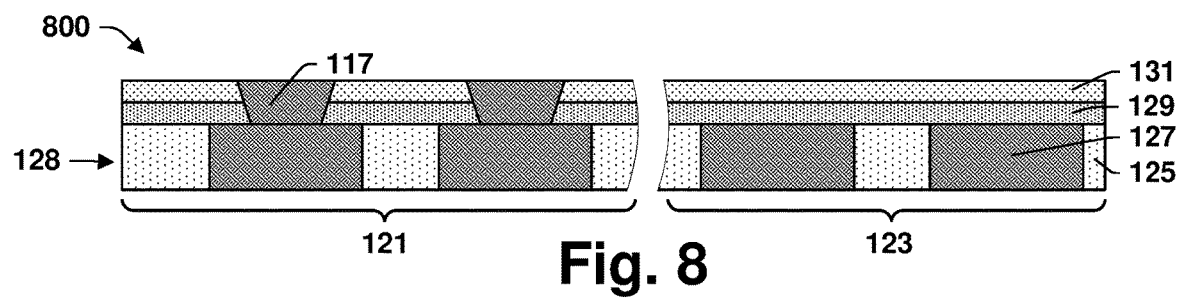

As illustrated by the cross-sectional view 700 of FIG. 7, mask 603 may be stripped and a layer of material 701 deposited to fill openings 601 with conductive material. As illustrated by the cross-sectional view 800 of FIG. 8, the layer of material 701 may be planarized to form vias 117. As previously noted, a diffusion barrier layer may be deposited before the bulk of the layer of material 701. The layer of material 701 may be formed by any suitable growth or deposition process. The planarization process may be chemical mechanical polishing (CMP) or any other suitable planarization process.

Figure 9:
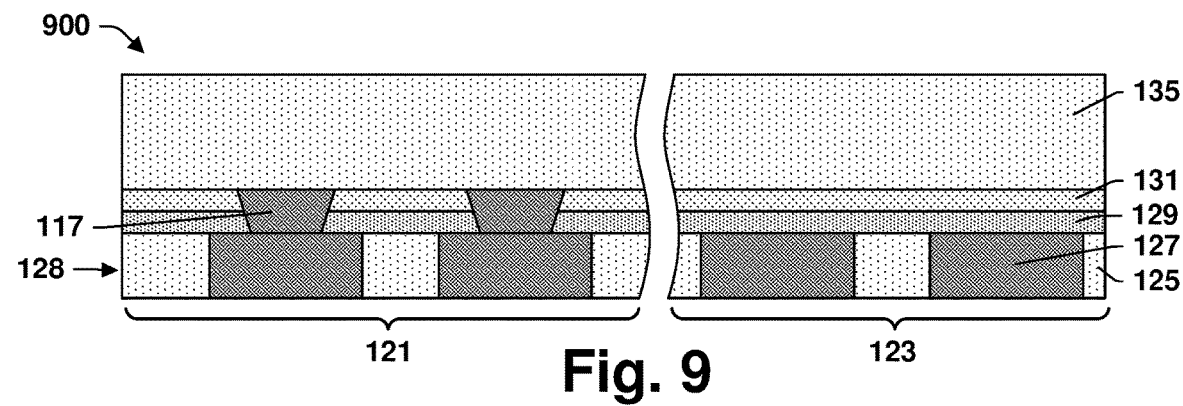

As illustrated by the cross-sectional view 900 of FIG. 9, interlevel dielectric layer 135 is formed over etch stop layer 129, interfacial layer 131, and vias 117. Interlevel dielectric 135 may be a low-κ or extremely low-κ dielectric formed by any suitable process. In some of these teachings, the thickness of interlevel dielectric layer 135 is in the range from 25 nm to 1000 nm. In some of these teachings, the thickness of interlevel dielectric layer 135 is in the range from 50 nm to 250 nm. In some of these teachings, the thickness of interlevel dielectric layer 135 is in the range from 75 nm to 200 nm, for example, about 100 nm. The thickness of interlevel dielectric layer 135 may be much greater than the combined thicknesses of etch stop layer 129 and interfacial layer 131.

Figure 10:
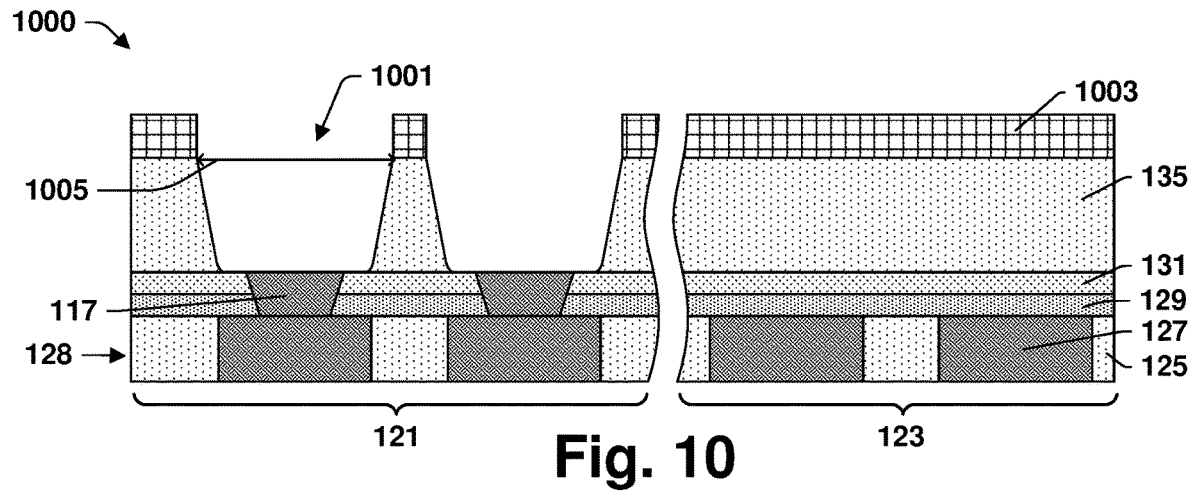

As illustrated by the cross-sectional view 1000 of FIG. 10, a mask 1003 may be formed over interlevel dielectric layer 135 and used to form openings 1001 through interlevel dielectric layer 135. Openings 1001 are positioned over vias 117. Mask 1003 may be a photoresist mask patterned using photolithography. Openings 1001 may be formed using any suitable wet or dry etching process, for example, plasma etching. A plasma etching process may be used to provide openings 1001 with steep sidewalls. The widths 1005 of openings 1001 may be in the range from 25 nm to 1000 nm. In some of these teachings, the widths 1005 of openings 1001 are in the range from 50 nm to 500 nm.

Figure 11:
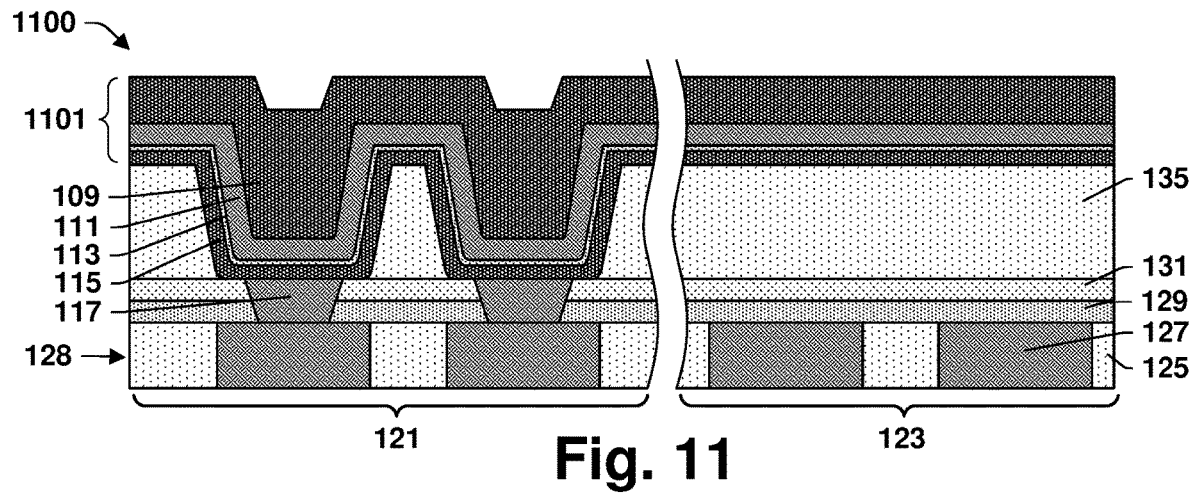

As illustrated by the cross-sectional view 1100 of FIG. 11, mask 1003 may be stripped and the layers of an RRAM call stack 1101 may be deposited conformally over the surface of the structure illustrated by the cross-sectional view 1000 of FIG. 10. In this example, RRAM call stack 1101 includes bottom electrode layer 115, switching layer 113, active metal layer 111, and top electrode layer 109. The combined thicknesses of these layers excluding the topmost, which is top electrode layer 109, are less than the depth of opening 1001 (See FIG. 10) and the thickness of interlevel dielectric layer 135, whereby planarizing as illustrated by the cross-sectional view 1200 of FIG. 12 forms a plurality of memory cells 103. In some of these teachings, top electrode layer 109 is formed to a sufficient thickness that RRAM call stack 1101 completely fills openings 1001. The planarization process may be, for example, CMP. Bottom electrode layer 115, switching layer 113, active metal layer 111, and top electrode layer 109 may be formed by any suitable process or combination of processes. Is some of these teachings, switching layer 113 is formed by an atomic layer deposition process such as plasma-enhanced atomic layer deposition whereby switching layer 113 has a uniform thickness across the bottom and side portions of memory cell 103.

Figure 12:
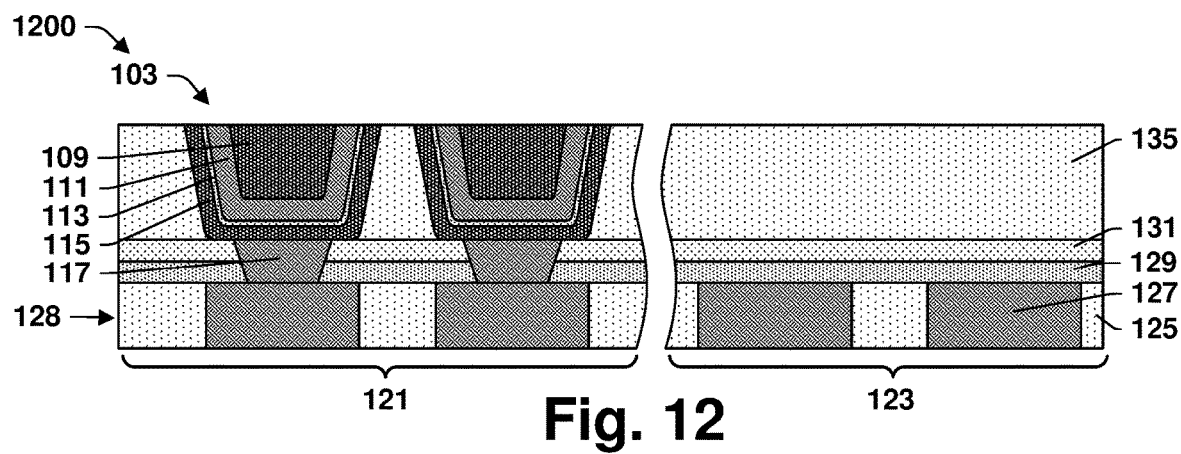
Figure 13:
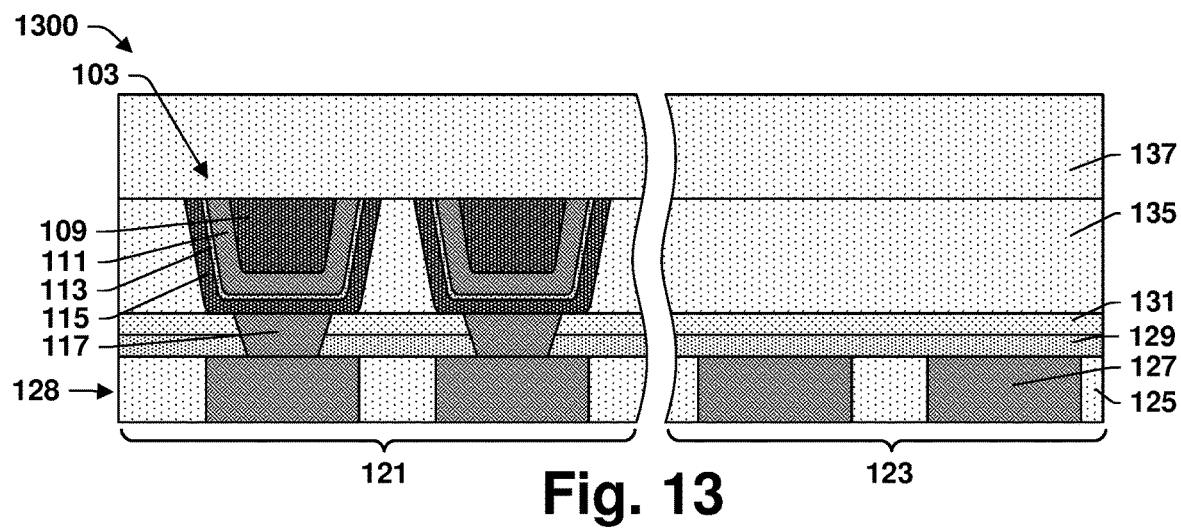

As illustrated by the cross-sectional view 1300 of FIG. 13, interlevel dielectric layer 137 is formed over the structure illustrated by the cross-sectional view 1200 of FIG. 12. Interlevel dielectric 137 may be the same material as interlevel dielectric layer 135. In some of these teaching, the thickness of interlevel dielectric layer 137 is less than the thickness of interlevel dielectric layer 135. In some of these teaching, the thickness of interlevel dielectric layer 135 is half or more the combined thickness of etch stop layer 129, interfacial layer 131, interlevel dielectric layer 135, and interlevel dielectric layer 137 or whatever combination of layer space the metal interconnect layer immediately below memory cell 103 from the metal interconnect layer immediately above memory cell 103.

Figure 14:
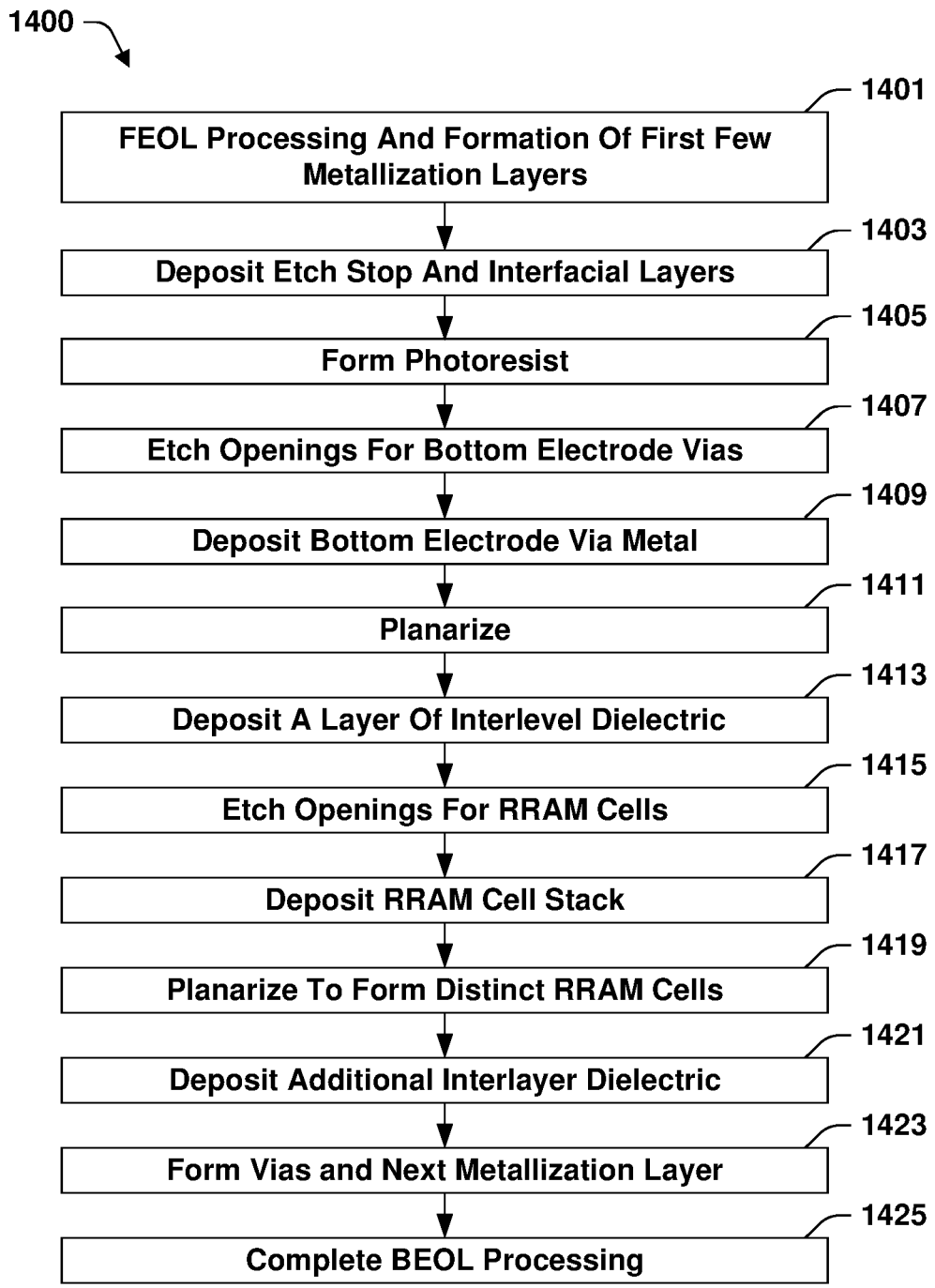
FIG. 14 present a flow chart of a manufacturing process according to some aspects of the present disclosure.

FIG. 14 provides a flow chart of a process 1400 according to some aspects of the present disclosure that may be used to produce integrated circuit devices according to the present disclosure. While process 1400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Process 1400 begins with act 1401, front-end-of-line (FEOL) processing and formation of a first few metal interconnect layers to produce a structure such as the one illustrated by cross-sectional view 400 of FIG. 4. Process 1400 continues with act 1403, depositing etch stop layer etch stop layer 129 and interfacial layer 131 to produce a structure such as the one illustrated by cross-sectional view 500 of FIG. 5.

Act 1405 is forming and patterning a mask 603 to pattern openings 601 in etch stop layer 129 and interfacial layer 131 for bottom electrode vias 117 as illustrated by cross-sectional view 600 of FIG. 6. Act 1407 is patterning openings 601 in etch stop layer 129 and interfacial layer 131, which is also illustrated by cross-sectional view 600 of FIG. 6.

Act 1409 is depositing a layer of material 701 fill openings 601 as illustrated by cross-sectional view 700 of FIG. 7. Act 1411 is planarizing to remove the layer of material 701 that lies outside opening 601, thereby forming vias 117 as illustrated by cross-sectional view 800 of FIG. 8.

Act 1413 is depositing interlevel dielectric layer 135 over vias 701 as illustrated by the cross-sectional view 900 of FIG. 9. Act 1415 is forming a mask 1003 over interlevel dielectric layer 135 and etching openings 1001 for RRAM cells 103 through interlevel dielectric layer 135 as illustrated by the cross-sectional view 1000 of FIG. 10.

Act 1417 is depositing an RRAM cell stack 1101 over openings 1001 as illustrated by the cross-sectional view 1100 of FIG. 11. RRAM call stack 1101 may include a bottom electrode layer 115, a switching layer 113, an active metal layer 111, and a top electrode layer 109. As illustrated by the cross-sectional view 1100 of FIG. 11, at least bottom electrode layer 115, switching layer 113, and active metal layer 111 are deposited conformally with respect to the shape of openings 1001.

Act 1419 is planarizing to remove the portions of the RRAM cell stack 1101 that lie outside of opening 1001, thereby forming RRAM cells 103 as illustrated by the cross-sectional view 1200 of FIG. 12. As illustrated by the cross-sectional view 1200, the planarization process may define the edges of RRAM cells 103 and leave the edges of RRAM cell all aligned in a single plane.

Act 1421 is depositing interlevel dielectric layer 137 over RRAM cells 103 as illustrated by the cross-sectional view 1300 of FIG. 13. Act 1423 is forming openings in and through interlevel dielectric layer 137 in memory region 121 and opening in and through interlevel dielectric layer 137 and interlevel dielectric layer 135 in peripheral region 123 and filling these openings with metal to form the fourth metal interconnect layer 138 and vias 102 and 133 connecting fourth metal interconnect layer 138 to top electrode layer 109 and third metal interconnect layer 128 as illustrated by the cross-sectional view 200 of FIG. 2. Act 1425 is additional processing to complete BEOL processing and the formation of an IC device 101.

Some aspects of the present teaching relate to an integrated circuit (IC) device that includes, a substrate, a metal interconnect structure formed over the substrate, and a resistance switching random access memory (RRAM) cell within the metal interconnect structure. The RRAM cell has a bottom electrode layer, a dielectric layer, and a top electrode. The bottom electrode layer curves whereby a top of the bottom electrode has the same height over the substrate as a of the top electrode.

Some aspects of the present teaching relate to an integrated circuit (IC) device that includes, a substrate, a metal interconnect structure formed over the substrate, and a resistance switching random access memory (RRAM) cell within the metal interconnect structure. The RRAM cell has a bottom electrode layer, a dielectric layer, and a top electrode. The RRAM cell is curved, whereby edges of the RRAM cell align in a plane parallel the surface.

Some aspects of the present teaching relate to an integrated circuit (IC) device that includes, a substrate, a metal interconnect structure formed over the substrate, and a resistance switching random access memory (RRAM) cell within the metal interconnect structure. The RRAM cell has a bottom electrode layer, a dielectric layer, and a top electrode and is curved whereby the RRAM cell has an edge that lies in a plane parallel the surface.

Some aspects of the present teaching relate to an integrated circuit (IC) device that includes, a substrate, a metal interconnect structure formed over the substrate, and a resistance switching random access memory (RRAM) cell within the metal interconnect structure. The RRAM cell has a bottom electrode layer, a dielectric layer, and a top electrode. The layer curve to terminate in an edge that forms a closed loop in a plane.

Some aspects of the present teaching relate to an integrated circuit (IC) device that includes, a substrate, a metal interconnect structure formed over the substrate, and a resistance switching random access memory (RRAM) cell within the metal interconnect structure. The RRAM cell has a bottom electrode layer, a dielectric layer, and a top electrode. The bottom electrode layer curves to encompass the RRAM dielectric layer.

Some aspects of the present teaching relate to a method of manufacturing an integrated circuit (IC) device. The method includes forming a metal interconnect layer over a semiconductor substrate, forming a dielectric layer over the metal interconnect layer, forming an opening in the dielectric layer, forming a resistance switching random access memory (RRAM) cell stack over the opening, and planarizing the RRAM cell stack to form an RRAM cell within the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
a substrate;
a metal interconnect structure formed over the substrate;
a memory cell formed within the metal interconnect structure, the memory cell comprising a bottom electrode, a top electrode, and a data storage structure between the bottom electrode and the top electrode;
a bottom electrode via corresponding to the bottom electrode; and
an etch stop layer and an interfacial layer underneath the bottom electrode and above the substrate;
wherein upper surfaces of the top electrode and the bottom electrode are coplanar; and
the bottom electrode via passes through the etch stop layer and the interfacial layer.

2. The IC device of claim 1, wherein the etch stop layer comprises silicon carbide (SiC).

3. The IC device of claim 1, wherein the bottom electrode and the data storage structure terminate at edges that form closed loops aligned in a plane.

4. The IC device of claim 1, wherein the bottom electrode encompasses the data storage structure.

5. The IC device of claim 4, wherein the data storage structure encompasses the top electrode.

6. The IC device of claim 1, wherein the bottom electrode is surrounded by a low κ dielectric layer.

7. The IC device of claim 1, wherein the bottom electrode is surrounded by an extremely low κ dielectric layer.

8. The IC device of claim 1, wherein the data storage structure comprises a resistance switching layer and an active metal layer.

9. An integrated circuit (IC) device, comprising:
a substrate;
a metal interconnect structure formed over the substrate;
a memory cell formed within the metal interconnect structure, the memory cell comprising a bottom electrode, a top electrode, and a data storage structure between the bottom electrode and the top electrode;
a bottom electrode via abutting the bottom electrode; and
an etch stop layer underneath the bottom electrode and above the substrate;
wherein the memory cell has an edge that comprises the bottom electrode and the top electrode;
the bottom electrode and the top electrode are curved so that the edge is flat and has a horizontal orientation;
the bottom electrode via passes through the etch stop layer or the interfacial layer; and
the etch stop layer comprises silicon carbide (SiC).

10. The IC device of claim 9, wherein the bottom electrode via passes through the etch stop layer and an interfacial layer.

11. The IC device of claim 9, wherein the bottom electrode forms a loop around the top electrode on the edge.

12. The IC device of claim 9, wherein the memory cell is disposed within a low K dielectric that is above the etch stop layer.

13. The IC device of claim 9, wherein:
the memory cell has an area that includes a bottom area and a side area; and
the side area is greater than the bottom area.

14. The IC device of claim 9, wherein the bottom electrode via passes through an interfacial layer that is distinct from the etch stop layer.

15. A method of manufacturing an integrated circuit (IC) device, comprising:
forming a metal interconnect layer over a semiconductor substrate;
forming an etch stop layer over the metal interconnect layer;
forming a via opening through the etch stop layer;
filling the via opening with metal to form a bottom electrode via;

forming a dielectric layer over the etch stop layer, wherein the dielectric layer is an oxide;
forming a memory cell opening in the dielectric layer;
forming a memory cell stack over the dielectric layer and the memory cell opening; and
planarizing the memory cell stack to form a memory cell within the memory cell opening.

16. The method of claim 15, wherein:
the memory cell opening in the dielectric layer has a width and a height; and
the height is at least half the width.

17. The method of claim 15, wherein:
forming the memory cell stack comprises successively forming a bottom electrode layer, a switching layer, and a top electrode layer;
forming the bottom electrode layer and the switching layer leaves the memory cell opening partially filled; and
forming the top electrode layer fills the memory cell opening.

18. The method of claim 15, wherein forming the memory cell stack comprises forming a bottom electrode layer, a switching layer, an active metal layer, and a top electrode layer.

19. The method of claim 15, wherein the dielectric layer is a low-κ dielectric layer.

20. The method of claim 19, further comprising:
forming an interfacial layer over the etch stop layer;
wherein forming the via opening through the etch stop layer comprises forming the via opening through the interfacial layer and the etch stop layer.

\* \* \* \* \*